US008757962B2

(12) United States Patent
Herbold et al.

(10) Patent No.: US 8,757,962 B2
(45) Date of Patent: Jun. 24, 2014

(54) SYSTEM AND METHOD FOR ADJUSTING A SHROUD BLOCK IN A CASING

(75) Inventors: John William Herbold, Fountain Inn, SC (US); Randall Stephen Corn, Travelers Rest, SC (US); Charles V. Spanos, Greenville, SC (US)

(73) Assignee: General Electric Company, Schenectady, NY (US)

( * ) Notice: Subject to any disclaimer, the term of this patent is extended or adjusted under 35 U.S.C. 154(b) by 337 days.

(21) Appl. No.: 13/161,891

(22) Filed: Jun. 16, 2011

(65) Prior Publication Data

US 2012/0317772 A1 Dec. 20, 2012

(51) Int. Cl.
*H01L 21/677* (2006.01)
*F01D 25/24* (2006.01)
*F03B 11/02* (2006.01)

(52) U.S. Cl.
USPC ............................ 415/126; 254/4 R; 414/800

(58) Field of Classification Search
USPC ......... 414/800; 29/402.01; 254/4 R, 2 B, 264
See application file for complete search history.

(56) References Cited

U.S. PATENT DOCUMENTS 2,819,113 A * 1/1958 Phillips ........................ 294/87.1
3,493,212 A * 2/1970 Scalzo et al. .................. 415/127
3,673,668 A * 7/1972 Crook ............................. 29/254
4,078,290 A * 3/1978 Fletcher et al. ................. 29/252
5,233,822 A * 8/1993 Ward et al. ....................... 60/772
6,974,503 B2 * 12/2005 Byrnes et al. ................. 118/500
7,024,744 B2 * 4/2006 Martin et al. ................ 29/401.1
7,118,021 B2 * 10/2006 Swartzbeck et al. ......... 228/44.3
7,455,505 B2 * 11/2008 Hartmann et al. ........ 416/219 R
7,556,475 B2 7/2009 Roberts, III et al.
8,117,727 B2 * 2/2012 McCarvill .................... 29/426.5
8,157,620 B2 * 4/2012 Corn et al. ...................... 451/57
8,276,273 B2 * 10/2012 Shigemoto et al. .......... 29/889.1
8,381,379 B2 * 2/2013 Holmes et al. .................. 29/254
2005/0188793 A1 * 9/2005 Cherry ......................... 81/57.33
2009/0265908 A1 * 10/2009 Corn et al. ................... 29/426.1
2010/0071183 A1 * 3/2010 McCarvill ....................... 29/244
2012/0087752 A1 * 4/2012 Herbold et al. ............... 408/1 R
2012/0145976 A1 * 6/2012 Hynous et al. .................. 254/98
2012/0204398 A1 * 8/2012 Herbold et al. .............. 29/426.2

* cited by examiner

*Primary Examiner* — Gregory Adams
*Assistant Examiner* — Lynn Schwenning
(74) *Attorney, Agent, or Firm* — Dority & Manning, PA

(57) ABSTRACT

A system and method for adjusting a shroud block in a casing are disclosed. The system includes a crane, an engagement device mounted to the shroud block, and a hoist connecting the engagement device and the crane. Actuation of the hoist can cause movement of the shroud block along a shroud hook of the casing. The method includes mounting an engagement device to the shroud block, and actuating a hoist connected to the engagement device. Actuation of the hoist can cause movement of the shroud block along a shroud hook of the casing.

16 Claims, 4 Drawing Sheets

FIG. –1–

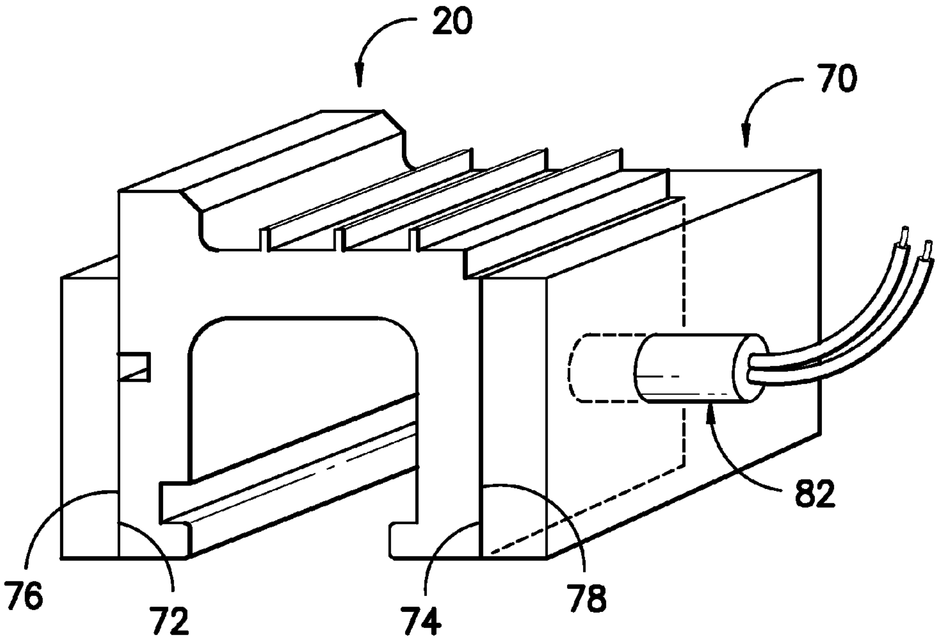
FIG. –3–
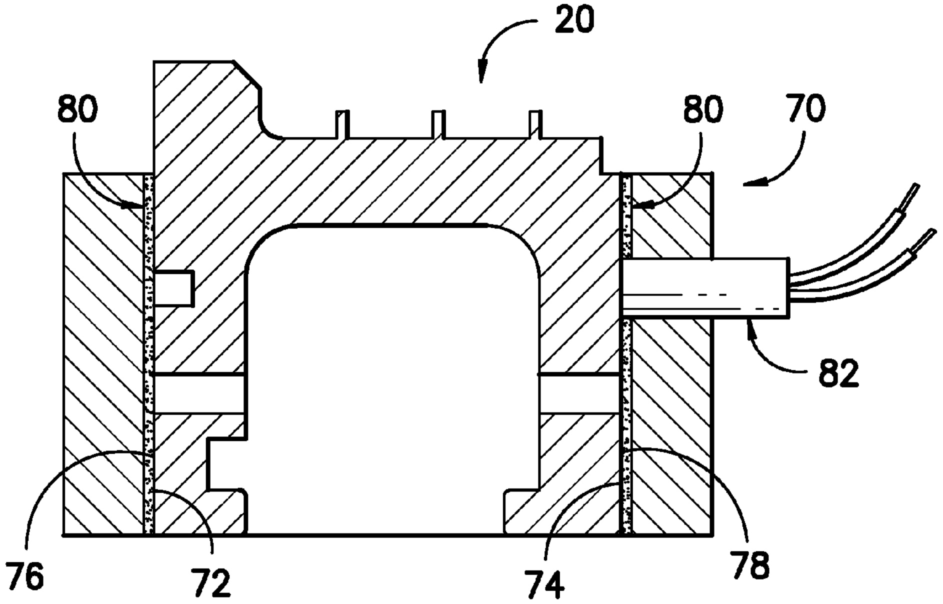
FIG. –4–

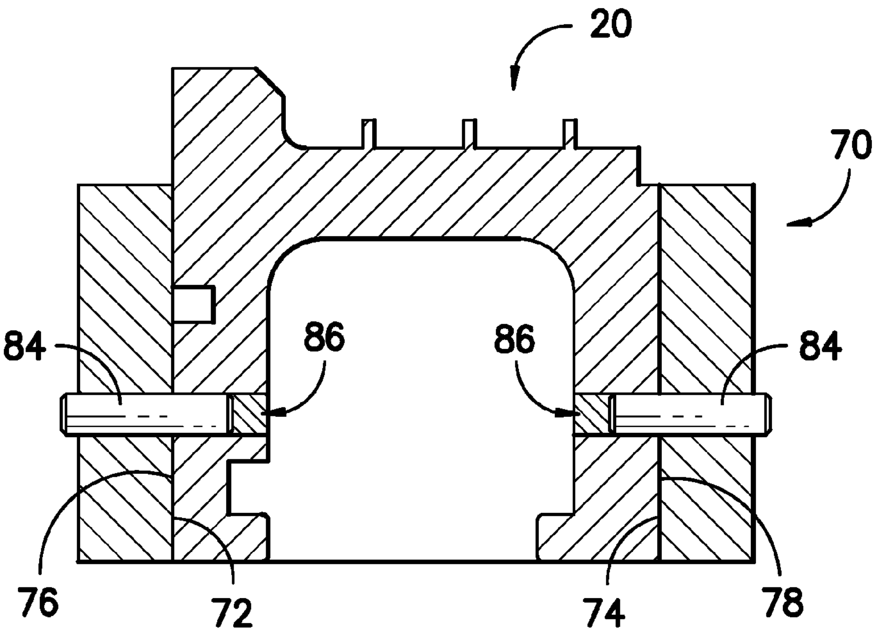
FIG. –5–
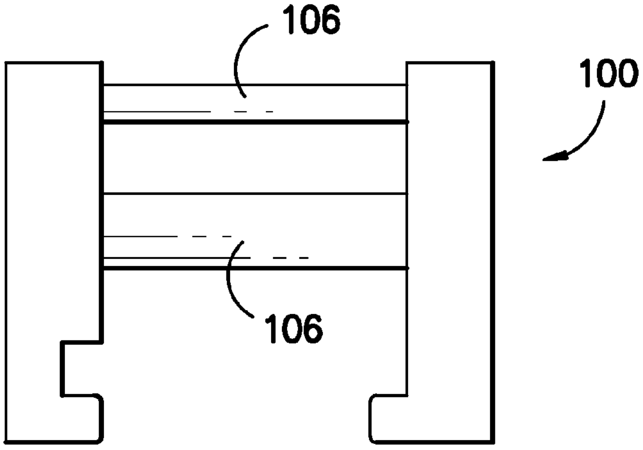
FIG. –6–

SYSTEM AND METHOD FOR ADJUSTING A SHROUD BLOCK IN A CASING

FIELD OF THE INVENTION

The present disclosure relates in general to shroud blocks, and more particularly to systems and methods for adjusting shroud blocks in casings.

BACKGROUND OF THE INVENTION

Turbine systems are widely utilized in fields such as power generation. For example, a conventional gas turbine system includes a compressor section, a combustor section, and at least one turbine section. The compressor section is configured to compress air as the air flows through the compressor section. The air is then flowed from the compressor section to the combustor section, where it is mixed with fuel and combusted, generating a hot gas flow. The hot gas flow is provided to the turbine section, which utilizes the hot gas flow by extracting energy from it to power the compressor, an electrical generator, and other various loads.

In a typical turbine system, a plurality of shroud blocks are disposed in an annular array radially outward of rotor blades and axially between nozzles, forming shrouds surrounding the rotor blades and nozzles. Typically, shrouds are provided in each stage of the turbine section of the turbine system, and are connected to a casing. In, for example, a gas turbine system, the shrouds may partially define the radial outer boundary of the hot gas path flowing therethrough.

Frequently during the life of a turbine system, such as during maintenance periods, the shroud blocks may require adjustments. For example, the shroud blocks may require cleaning, modification, or replacement, and must thus be removed from the casing. Currently, shroud blocks are adjusted by using various existing tools, such as sledgehammers and crow bars, to crudely move the seals along the casing as required. However, this approach is both time-consuming and potentially damaging to the shroud blocks and other various components of the turbine system. Additionally, in many cases, the shroud blocks may be difficult to reach. For example, if the rotor components of the turbine system are not removed before adjustments to the shroud blocks are attempted, there is relatively little access space for a worker to reach the shroud blocks for adjustment. Thus, it is difficult or impossible to utilize existing tools to adjust the shroud blocks.

Thus, an improved system and method for adjusting a shroud block in a casing are desired in the art. For example, a system and method that allow for adjustment of a shroud block in a location with relatively little access space would be advantageous. Further, a system and method that do not require the use of additional tools would be advantageous.

BRIEF DESCRIPTION OF THE INVENTION

Aspects and advantages of the invention will be set forth in part in the following description, or may be obvious from the description, or may be learned through practice of the invention.

In one embodiment, a system for adjusting a shroud block in a casing is disclosed. The system includes a crane, an engagement device mounted to the shroud block, and a hoist connecting the engagement device and the crane. Actuation of the hoist can cause movement of the shroud block along a shroud hook of the casing.

In another embodiment, a method for adjusting a shroud block in a casing is disclosed. The method includes mounting an engagement device to the shroud block, and actuating a hoist connected to the engagement device. Actuation of the hoist can cause movement of the shroud block along a shroud hook of the casing.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 3 is a perspective view of an engagement device mounted to a shroud block according to one embodiment of the present disclosure;

FIG. 4 is a cross-sectional view of an engagement device mounted to a shroud block according to one embodiment of the present disclosure;

FIG. 5 is a cross-sectional view of an engagement device mounted to a shroud block according to another embodiment of the present disclosure; and FIG. 6 is a cross-sectional view of a trolley according to one embodiment of the present disclosure.

DETAILED DESCRIPTION OF THE INVENTION

Figure 1:
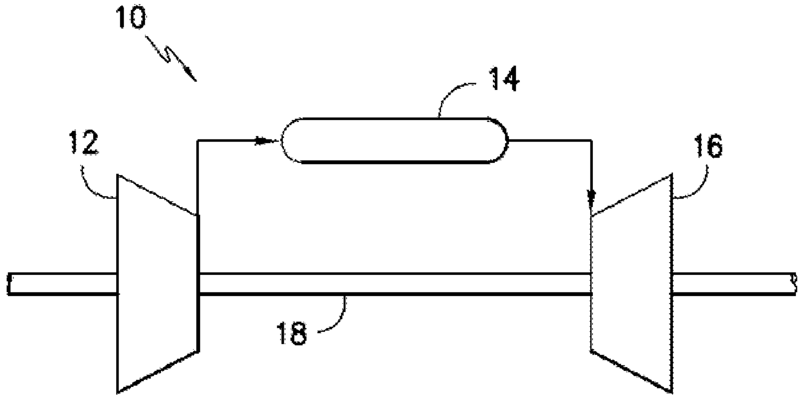
FIG. 1 is a schematic illustration of one embodiment of a turbine system according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Referring to FIG. 1, a schematic view of a turbine system 10 is illustrated. The turbine system 10 as shown in FIG. 1 is a gas turbine system. Thus, the system 10 comprises a compressor section 12 for pressurizing a gas, such as air, flowing into the system 10. It should be understood that while the gas may be referred to herein as air, the gas may be any gas suitable for use in a gas turbine system 10. Pressurized air discharged from the compressor section 12 flows into a combustor section 14, which is generally characterized by a plurality of combustors disposed in an annular array about an axis of the system 10. The air entering the combustor section 14 is mixed with fuel and combusted. Hot gases of combustion flow from the combustor section 14 to a turbine section 16 to drive the system 10 and generate power. It should be understood, however, that the turbine system 10 of the present disclosure is not limited to gas turbine systems, and that any suitable turbine system is within the scope and spirit of the present disclosure.

The turbine system 10 may include a shroud (not shown), or a plurality of shrouds, therein. For example, the shrouds may be included in the turbine section 16 or in any other suitable section or location in the turbine system 10. Each shroud may be generally annular, and may comprise a plurality of shroud blocks 20 (see FIGS. 2 through 6) disposed in an annular array to form the shroud. The shroud according to the present disclosure may be located in any suitable position in the turbine system 10. For example, in the turbine section 16 of the turbine system 10, the shroud may be associated with the stage one rotor blades and/or nozzles, the stage two rotor blades and/or nozzles, or the stage three rotor blades and/or nozzles. Alternatively, the shroud may be associated with any suitable stage or location in the turbine section 16 or other section or location in the turbine system 10.

Figure 2:
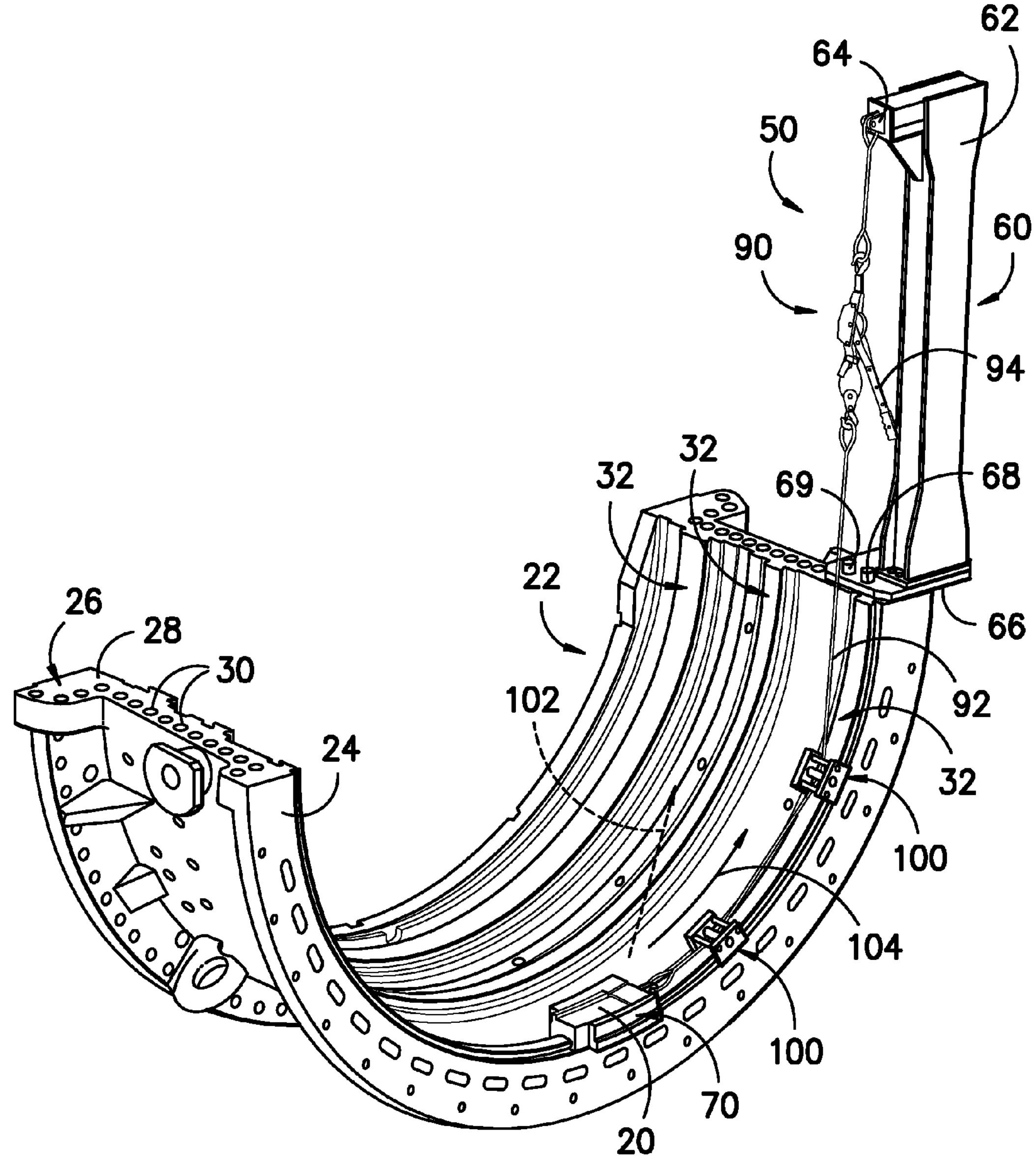
FIG. 2 is a perspective view of a system according to one embodiment of the present disclosure.

As shown in FIG. 2, the shroud, and shroud blocks 20 thereof, may be connected to a casing 22. The casing 22 generally surrounds the various components of the turbine section 16 or other suitable section in the turbine system 10. A typical casing 22 includes an upper casing section (not shown) and a lower casing section 24 which are connected together at a joint 26. The joint may be formed by, for example, mating surfaces of the upper casing section and lower casing section 24, such as mating surface 28 of the lower casing section 24. Bore holes 30 may be defined in the mating surfaces, and mechanical fasteners, such as nut/bolt combinations, screws, or other suitable mechanical fasteners, may be inserted through the bore holes of the mating surfaces to couple the upper casing section and lower casing section 24 together, forming a casing 22. It should be understood, however, that a casing 22 according to the present disclosure is not limited to the above disclosed embodiment, and rather that any suitable casing is within the scope and spirit of the present disclosure.

Each shroud block 20 may be connected to the casing 22 on a shroud hook 32 extending from the casing 22. The shroud hook 32 may be a generally annular portion of the casing 22 extending from the inner surface of the casing 22. The shroud hook 32 may have a cross-sectional male or female profile, such as a male generally T-shaped profile as shown in FIG. 2, such that the shroud hook 32 generally mates with a similar feature of a shroud block 20, as is generally known in the art. Thus, each shroud block 20 may be connected to a shroud hook 32 to form a shroud, and may move generally circumferentially along the shroud hook 32 as desired or required.

FIG. 2 further illustrates a system 50 for adjusting a shroud block 20 in a casing 22. The system 50 advantageously allows for the adjustment of a shroud block 20 that is in a location with relatively little access space, such as when rotor elements of the turbine system 10 have not been removed from the casing 22. Further, the system 50 does not require the use of additional tools. Use of the system 50 according to the present disclosure may additionally reduce the time required for adjusting a shroud block 20, and further prevent or reduce any potential damage to the shroud blocks 20 and other various components of the turbine system 10 during adjustment.

As shown, the system 50 includes a crane 60, which may in some embodiments be portable. The crane 60 may be connected to the casing 22, or may be separate from the casing 22. The crane 60 may comprise a boom 62, which may be formed from a singular member or a plurality of members, such as plates. A connection point 64 may be connected to the boom 62 at any location on the boom 62, such as adjacent to a distal end 64 of the boom 62 with respect to the casing 22. The connection point 64 may be welded, mechanically fastened, or otherwise connected to the boom 62, or may be integral with the boom 62. In some embodiments, the connection point 64 may be a hook or hole defined in or connected to a transverse arm that is connected to the boom 62, as shown. Further, in some embodiments, a connection plate 66 may be connected to the boom 62 at any location on the boom 62, such as adjacent to a proximal end 62 of the boom 62 with respect to the casing 22. The connection plate 66 may be welded, mechanically fastened, or otherwise connected to the boom 62, or may be integral with the boom 62. The connection point 64 may connect other components of the system 50, as discussed below, to the boom 62. The connection plate 66 may connect the crane 60 to the casing 22 or other suitable location separate from the casing.

For example, in some embodiments as shown in FIG. 2, the crane 60 may be connected to the casing 22. In these embodiments, the connection plate 66 may serve to connect the crane 60 to the casing 22. For example, the connection plate 66 may define a bore hole 68 or plurality of bore holes 68 therethrough. A bore hole 68 may be aligned with a bore hole 30 defined in the casing 22, and a mechanical fastener 69 may be inserted through the bore holes 68 and 30 to connect the crane 60 to the casing 22. Alternatively, the connection plate 66 may be clamped or otherwise connected to the casing 22. In exemplary embodiments, the connection plate 66 is removably connected to the casing 22.

In alternative embodiments, the crane 60 may be separate from the casing 22. For example, the crane 60 may be connected to the ground or floor adjacent to the casing 22, or may be a stand-alone structure, or may be otherwise placed in a position suitable for interaction with the casing 22 and shroud blocks 20.

The system 50 further includes an engagement device 70. The engagement device 70 mounts to a shroud block 20, thus engaging the shroud block 20 to facilitate adjustment of the shroud block 20. Thus, once the engagement device 70 is mounted to a shroud block 20, movement of the engagement device 70 may cause movement of the shroud block 20. For example, if the engagement device 70 is subjected to a pulling force, the engagement device may similarly pull the shroud block 20, thus moving the shroud block 20 along the shroud hook 32.

In some embodiments, as shown in FIGS. 3 through 5, for example, the engagement device 70 may include a first inner surface 72 and a second inner surface 74. The second inner surface 74 may be spaced apart from the first inner surface 72. The first inner surface 72 may mount to a first side surface 76 of the shroud block 20, while the second inner surface 74 may mount to a second side surface 78 of the shroud block 20. Thus, in exemplary embodiments, the first and second inner surfaces 72 and 74 may be generally planar surfaces that, when mounted to the shroud block 20, abut with the first and second side surfaces 76 and 78. Additionally or alternatively, the first and second inner surfaces 72 and 74 may have any suitable shapes that facilitate abutment of the surfaces with the first and second side surfaces 76 and 78.

In exemplary embodiments, the first and second inner surfaces 72 and 74 are frictionally mounted to the first side surface 76 and second side surface 78. In these embodiments, the first and second inner surfaces 72 and 74, when abutting the first and second side surfaces 76 and 78, are generally prevented from moving relative to the first and second side surfaces 76 and 78 due to the friction between the various abutting surfaces. In order to obtain a desirable friction, the inner surfaces 72 and 74 may be formed from materials with relatively high coefficients of friction, such as steels or aluminums, other suitable metals or metal alloys, or other suitable materials with high coefficients of friction. Additionally or alternatively, the inner surfaces 72 and 74 may be treated, such as sand blasted or otherwise abrased, shot peened, or otherwise treated. Additionally or alternatively, as shown in FIG. 4 a coating 80 may be applied to one or both of the first and second inner surface 72 and 74. The coating 80 may have a relatively high coefficient of friction, and may be treated as discussed above if desired. For example, in exemplary embodiments, the coating 80 may include a tungsten carbide or any other suitable materials for mounting to the first and second side surfaces 76 and 78.

In some embodiments, as shown in FIG. 5, the engagement device 70 may include a clamp mechanism. The clamp mechanism may be, for example, a hydraulic cylinder 82 as shown, a pneumatic cylinder, a gear-driven device, or any other suitable mechanism that can clamp a component such as a shroud block 20. Actuation of the clamp mechanism may clamp the engagement device 70 to the shroud block 20, thus further facilitating mounting of the engagement device 70 to the shroud block 20. For example, the clamping mechanism may directly press against one or more surfaces of the shroud block 20, such as first side surface 76 and/or second side surface 78, to clamp the clamping mechanism and thus the engagement device 70 to the shroud block 20. Alternatively, the clamping mechanism may cause a component of the engagement device 70, such as first inner surface 72 and/or second inner surface 74, to press against and thus clamp the shroud block 20, as discussed above.

In some embodiments, as shown in FIG. 4, the engagement device 70 may include a pin 84 or pins 84. The pins 84 may be sized and shaped to be inserted into any suitable bore hole 86 defined in the shroud block 20, such as retaining holes, cooling holes, borescope holes, probe holes, and or other suitable holes. It should be noted that the bore holes 86 may be defined in any suitable surface or surfaces of the shroud block 20, including side surfaces, inward or outward facing surfaces, or circumferentially facing surfaces. Insertion of a pin 84 into a bore hole 86 may further facilitate mounting of the engagement device 70 to the shroud block 20. The pins 84 may be integral with the engagement device 70, or may be separate components coupled to the engagement device 70.

The system 50 further includes a hoist 90, as shown in FIG. 2. The hoist 90 connects the engagement device 70 to the crane 60. For example, the hoist 90 may be connected to the crane 60 at connection point 64. Additionally, a strap 92, chain, or other suitable tether may extend between and be connected to the hoist 90 and the engagement device 70, thus connecting the engagement device 70 and hoist 90.

Further, actuation of the hoist 90 can cause movement of the shroud block 20 along the shroud hook 32, thus adjusting the shroud block 20. For example, in some embodiments, the hoist 90 may include a ratchet lever 94. The hoist 90 may be actuated through ratcheting of the ratchet lever 94, which may exert a pulling force on the strap 92, chain, or other suitable tether. This pulling force may in turn be exerted on the engagement device 70, pulling the engagement device 70 and thus exerting a pulling force on the shroud block 20. This pulling force can thus cause movement of the shroud block 20 along the shroud hook 32.

Additionally or alternatively, the hoist 90 may include a hydraulic system, pneumatic system, or other suitable hoisting system that may be actuated to cause movement of the shroud block 20. Further, it should be understood that actuation of the hoist 90 may exert any suitable force, such as a pulling force or a pushing force, on the shroud block 20 in order to cause movement of the shroud block 20.

In some embodiments, as shown in FIGS. 2 and 6, the system 50 may further include a trolley 100 or a plurality of trolleys 100. Each trolley 100 may be connected to the shroud hook 32, casing 22, or other suitable component, and may direct a force on the shroud block 20 caused by actuation of the hoist 90. For example, as shown in FIG. 6, for a shroud block 20 positioned as shown, if a hoist 90 were actuated, force 102 would be exerted on the shroud block 20, with a large component of such force 102 moving the shroud block 20 away from the shroud hook 32 rather than along the shroud hook 32. As further shown in FIG. 6, a trolley may direct such force, thus causing force 104 to be exerted on the shroud block 20, with a large component of such force 104 desirably moving the shroud block 20 along the shroud hook 32. Thus, in some embodiments, the strap 92, chain, or other suitable tether extending between and connecting the hoist 90 and the engagement device 70 may be passed through a trolley 100. Bars or rollers 106 on the trolley may guide the strap 92, chain, or other suitable tether through the trolley 100 when the hoist 90 is actuated, thus directing the force that is exerted on the shroud block 20.

In some embodiments, a trolley 100 may be fixedly connected to, for example, the shroud hook 32 or other suitable component. When the trolley 100 is fixedly connected, it is generally stationary with respect to the shroud hook 32 during operation of the system 50. Thus, the shroud hook 32 may be fixedly connected through mechanical fasteners, welding, or any other suitable connection apparatus or process. In other embodiments, a trolley may be movably connected to, for example, the shroud hook 32 or other suitable component. When the trolley 100 is movably connected, it is generally movable with respect to the shroud hook 32 during operation of the system 50. Thus, for example, the trolley 100 may mate with the shroud hook 32, as discussed above with respect to the shroud block 20. The trolley 100 may slide along the shroud hook 32 and thus be movably connected, or may be fixedly connected to the shroud hook 32.

It should be understood that the various components of the system 50 may, in exemplary embodiments, be removable from the casing 22, shroud block 20, and various components thereof. For example, the crane 60, engagement device 70, hoist 90, and trolley 100 may all be removed from any mount or connection as discussed above after operation of the system 50 to adjust various shroud blocks 20 as desired.

The present disclosure is further directed to a method for adjusting a shroud block 20 in a casing 22. The method may include mounting an engagement device 70 to the shroud block 20, and actuating a hoist 90 connected to the engagement device 70, as discussed above. Actuation of the hoist 90 can cause movement of the shroud block 20 along a shroud hook 32 of the casing 22.

In some embodiments, the method may further include connecting a crane 60 to, for example, the casing 22, as discussed above. In some embodiments, the method may further include directing a force on the shroud block 20 caused by actuation of the hoist 90. For example, trolleys 100 may direct such force, as discussed above.

The step of mounting an engagement device 70 to the shroud block 20 may, in some embodiments, comprise mounting a first inner surface 72 to a first side surface 76 and mounting a second inner surface 74 to a second side surface 78, as discussed above. Additionally or alternatively, the step of mounting an engagement device 70 to the shroud block 20 may include, for example, inserting a pin 84 within a bore hole 86 defined in the shroud block 20. Additionally or alternatively, the step of mounting an engagement device 70 to the shroud block 20 may include clamping the engagement device 70 to the shroud block 20. For example, a clamp mechanism may be actuated to clamp the engagement device 70 to the shroud block 20, as discussed above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for adjusting a shroud block connected to a shroud hook in a casing, the system comprising:

a crane;

an engagement device mounted to the shroud block, wherein the engagement device comprises a first inner surface frictionally mounted to a first side surface of the shroud block and a second inner surface frictionally mounted to a second opposing side surface of the shroud block, the second inner surface generally parallel to the first inner surface, the shroud block further comprising a channel defined between the first side surface and second opposing side surface for connecting the shroud block to the shroud hook; and a hoist connecting the engagement device and the crane, wherein actuation of the hoist pulls the shroud block along the shroud hook of the casing.

2. The system of claim 1, wherein the crane is connected to the casing.

3. The system of claim 1, further comprising a coating applied to each of the first inner surface and the second inner surface, and wherein the coating comprises a tungsten carbide.

4. The system of claim 1, wherein the engagement device comprises a pin inserted within a bore hole defined in the shroud block.

5. The system of claim 1, wherein the engagement device comprises a clamp mechanism, and wherein actuation of the clamp mechanism clamps the engagement device to the shroud block.

6. The system of claim 1, wherein the hoist comprises a ratchet lever.

7. The system of claim 1, further comprising a trolley connected to the shroud hook for directing a force on the shroud block caused by actuation of the hoist.

8. The system of claim 1, wherein the trolley is fixidly connected to the shroud hook.

9. A method for adjusting a shroud block connected to a shroud hook in a casing, the method comprising:

mounting an engagement device to the shroud block, wherein the engagement device comprises a first inner surface frictionally mounted to a first side surface of the shroud block and a second inner surface frictionally mounted to a second opposing side surface of the shroud block, the second inner surface generally parallel to the first inner surface, the shroud block further comprising a channel defined between the first side surface and second opposing side surface for connecting the shroud block to the shroud hook;

actuating a hoist connected to the engagement device, wherein actuation of the hoist pulls the shroud block along the shroud hook of the casing.

10. The method of claim 9, further comprising connecting a crane to the casing, wherein the hoist connects the engagement device to the crane.

11. The method of claim 9, further comprising directing a force on the shroud block caused by actuation of the hoist.

12. The method of claim 9, wherein the engagement device further comprises a coating applied to each of the first inner surface and the second inner surface, and wherein the coating comprises a tungsten carbide.

13. The method of claim 9, wherein the step of mounting an engagement device to the shroud block comprises inserting a pin of the engagement device within a bore hole defined in the shroud block.

14. The method of claim 9, further comprising clamping the engagement device to the shroud block.

15. The method of claim 14, wherein the engagement device comprises a clamp mechanism, and wherein actuation of the clamp mechanism clamps the engagement device to the shroud block.

16. The method of claim 9 wherein the hoist comprises a ratchet lever.

* * * * *